United States Patent [19]
Tsuneda et al.

[11] Patent Number: 5,402,260
[45] Date of Patent: Mar. 28, 1995

[54] ELEMENT FOR OPTICAL ISOLATOR AND OPTICAL ISOLATOR EMPLOYING THE SAME, TOGETHER WITH SEMICONDUCTOR LASER MODULE EMPLOYING THE OPTICAL ISOLATOR ELEMENT

[75] Inventors: Yukiko Tsuneda; Michitaka Okuta; Yasushi Sato, all of Tokyo, Japan

[73] Assignee: Kyocera Corporation, Kyoto, Japan

[21] Appl. No.: 919,283

[22] Filed: Jul. 24, 1992

Related U.S. Application Data

[62] Division of Ser. No. 740,297, Aug. 5, 1991.

[30] Foreign Application Priority Data

| Aug. 6, 1990 | [JP] | Japan | 2-208653 |
| Aug. 8, 1990 | [JP] | Japan | 2-84314 U |
| Aug. 13, 1990 | [JP] | Japan | 2-85591 U |
| Mar. 8, 1991 | [JP] | Japan | 3-069010 |
| May 14, 1991 | [JP] | Japan | 3-138496 |

[51] Int. Cl.⁶ .............................. G02F 1/09
[52] U.S. Cl. ................... 359/282; 359/484; 359/501; 372/703
[58] Field of Search ........... 357/484, 485, 494, 497, 357/501, 281, 282; 372/703

[56] References Cited

U.S. PATENT DOCUMENTS

| 4,461,543 | 7/1984 | McMahon | 385/8 |
| 4,604,577 | 8/1986 | Matsummura et al. | 359/282 |
| 4,686,678 | 8/1987 | Ohta et al. | 372/33 |
| 4,756,607 | 7/1988 | Watanabe et al. | 350/375 |
| 4,770,505 | 9/1988 | Okazaki | 350/377 |
| 5,040,863 | 8/1991 | Kawakami et al. | |
| 5,076,675 | 12/1991 | Kusaka et al. | |

FOREIGN PATENT DOCUMENTS

| 62-73227 | 4/1987 | Japan . |
| 62-242915 | 10/1987 | Japan . |
| 63-49728 | 3/1988 | Japan . |
| 174524 | 3/1989 | Japan . |
| 229714 | 1/1990 | Japan . |
| 2123321 | 5/1990 | Japan . |

OTHER PUBLICATIONS

Gritz, David N., "Near-infrared (IR) Polarizing Glass", SPIE vol. 750, Infrared systems and Components (1987), pp. 18-26.

Primary Examiner—Ricky D. Shafer
Attorney, Agent, or Firm—Spensley Horn Jubas & Lubitz

[57] ABSTRACT

An element for an optical isolator which is formed by alternately bonding together at least one flat plate-shaped Faraday rotator and two or more flat plate-shaped polarizers, the optical isolator element having an outer peripheral surface which is cut such that, when the outer peripheral surface is disposed parallel to an optical axis, incidence and emergence planes of the element are inclined at a predetermined angle with respect to a plane perpendicular to the optical axis. The optical isolator element may be formed with a rectangular configuration in conformity to the arranged form of a plurality of laser active regions of a laser array.

1 Claim, 13 Drawing Sheets

FIG. 8
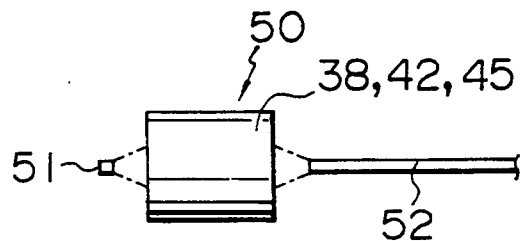
FIG. 9(A)     FIG. 9(B)
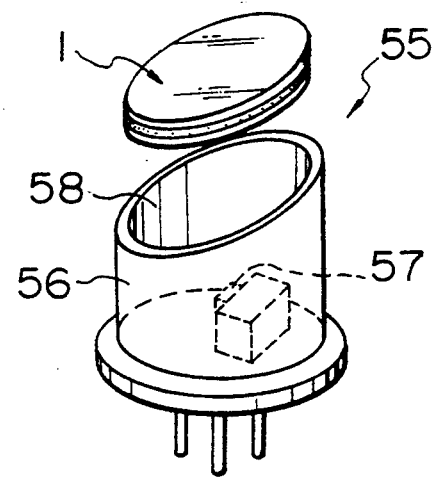 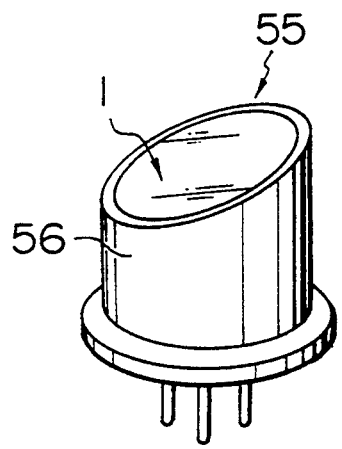
FIG. 10(A)   FIG. 10(B)   FIG. 10(C)
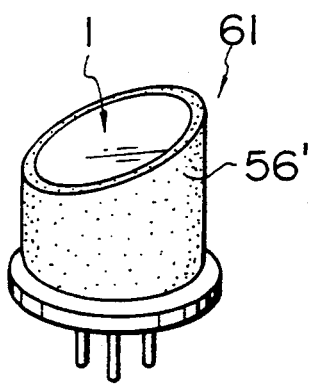 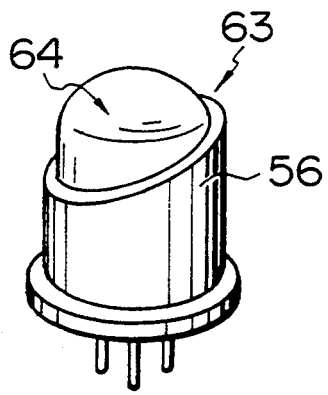 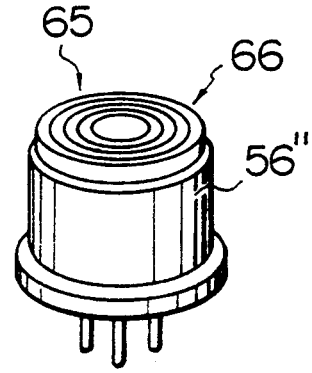

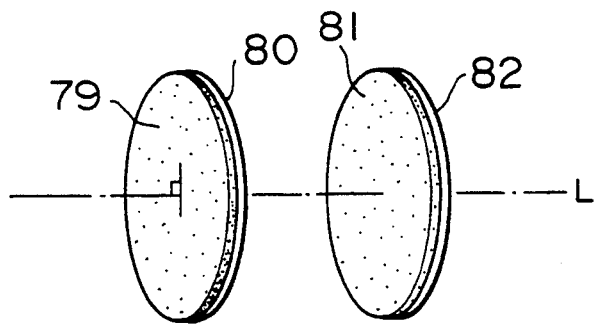
FIG. 13(A)
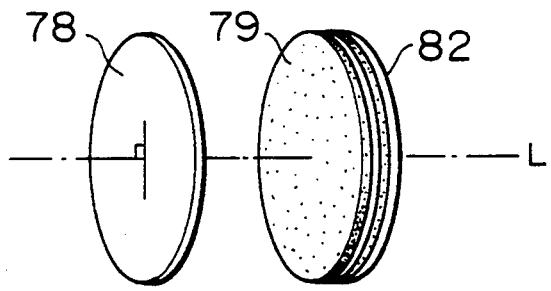
FIG. 13(B)
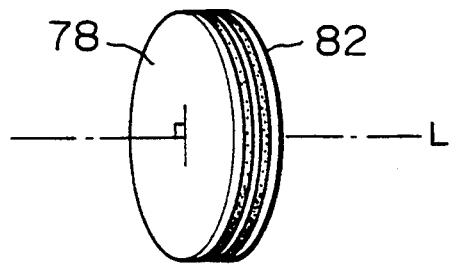
FIG. 13(C)
FIG. 13(D)
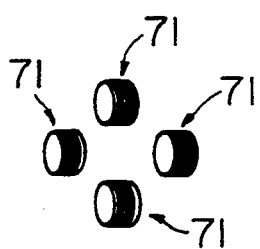
FIG. 13(E)
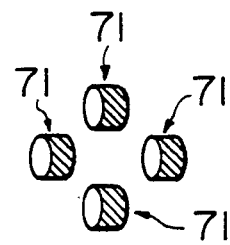
FIG. 13(F)
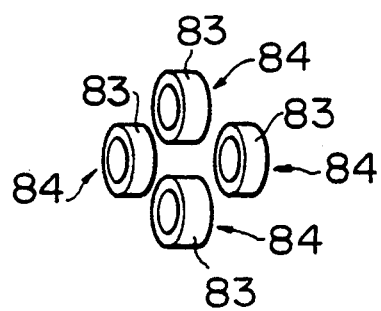

ELEMENT FOR OPTICAL ISOLATOR AND OPTICAL ISOLATOR EMPLOYING THE SAME, TOGETHER WITH SEMICONDUCTOR LASER MODULE EMPLOYING THE OPTICAL ISOLATOR ELEMENT

This is a division of application Ser. No. 07/740,297, filed on Aug. 5, 1991.

BACKGROUND OF THE INVENTION

The present invention relates to an element for an optical isolator which is used to remove a reflected beam occurring when light emitted from a light source is introduced into various kinds of optical element or an optical fiber. The present invention also relates to an optical isolator and a semiconductor laser module, which employ such an optical isolator element.

Light emitted from a light source, for example, a laser light source, is made incident on a variety of optical elements or an optical fiber, and a part of the incident light is reflected or scattered by the end faces and inside of the optical elements or the optical fiber.

A part of the reflected or scattered light returns to the light source in the form of a reflected beam. To prevent the return of the reflected beam, an optical isolator is employed.

A typical conventional optical isolator employed for this purpose has heretofore been arranged such that two polarizers, each comprising a bulk polarizing beam splitter, are disposed at both sides, respectively, of a flat plate-shaped Faraday rotator, and these three parts are accommodated in a cylindrical magnet. In general, the Faraday rotator is formed with a thickness necessary to rotate the plane of polarization of light with a predetermined wavelength through 45° in a saturated magnetic field, and the two polarizers are adjusted so that the respective directions of transmitted polarization are 45° offset from each other in the direction of rotation.

To obtain a large isolation by employing the optical isolator of the type described above, it has been a conventional practice to use a plurality of optical isolators which are arranged in series.

In the meantime, the optical isolator with the above-described structure comprises a Faraday rotator and two polarizers, which are discrete parts, and therefore needs not only a relatively large number of steps to assemble it but also a troublesome operation to effect an optical adjustment between these parts.

Under these circumstances, there has also been proposed an optical isolator comprising an optical isolator element with a structure in which a flat plate-shaped (multilayer film-shaped) polarizer is bonded directly to each face of a flat plate-shaped Faraday rotator, the optical isolator element being disposed in a cylindrical magnet.

However, the proposed optical isolator, in which a plate-shaped polarizer is bonded to each face of a Faraday rotator to form an integral structure, still suffers from problems listed below:

(1) To secure the optical isolator element in position inside the cylindrical magnet, a given fixing jig is needed, which increases the number of parts required to form the optical isolator, and it is necessary to conduct a troublesome operation for mounting the optical isolator element in the magnet.

(2) If light vertically enters or emerges from the plane of incidence or emergence of the optical isolator element, the reflected light from the end faces of the polarizers and the Faraday rotator returns to a light source, e.g., a semiconductor laser. To prevent the occurrence of such a phenomenon, the optical isolator element should be installed with a predetermined angle so that the planes of incidence and emergence are not perpendicular to the direction of incidence of light. However, in order to secure the optical isolator element with an angle in the cylindrical magnet, it is necessary to employ an element fixing jig with a complicated structure and conduct an even more troublesome operation for mounting the optical isolator element.

(3) Since the Faraday rotation angle of the Faraday rotator varies with temperature or wavelength, the isolation that is effected by an optical isolator system comprising a single optical isolator has a peak at a predetermined temperature or a predetermined wavelength and it is considerably inferior at temperatures or wavelengths other than the predetermined level. Thus, a plurality of optical isolators should be arranged in series to form an optical isolator system in order to obtain a high isolation over a wide temperature or wavelength range. However, if a plurality of optical isolators are installed in series, the number of parts increases and the number of assembling steps also increases, and further the adjustment of optical axes becomes complicated, resulting in low mass-productivity. In addition, since the multi-stage optical isolator system has a long optical path length, the effective aperture (the area where a beam can pass) becomes small. Further, the increase in the optical path length results in an increase in the overall size of the optical isolator system.

(4) In a conventional semiconductor laser array comprising a plurality of laser active regions arrayed in a line in close proximity to each other, an optical isolator of the type described above is disposed at a position corresponding to each laser active region. However, since the reduction in size of each optical isolator is limited, even if the spacing between each pair of adjacent laser active regions can be reduced, the spacing between optical isolators cannot be reduced correspondingly. In other words, it is impossible to achieve a reduction in the overall size of the semiconductor laser array. The limitation on the reduction in size of optical isolators is due to the fact that it is difficult to reduce the size of the cylindrical magnet of each optical isolator and that, if the size of the magnet is reduced, the magnetic force decreases, so that it becomes impossible to apply the necessary magnetic field to the Faraday rotator. In addition, a reduction in the size of the magnet results in a reduction in the effective aperture of each of the optical parts accommodated inside the magnet.

(5) There has heretofore been a semiconductor laser module wherein a coupling lens is disposed on an optical axis at at least one side of the optical isolator and a semiconductor laser is disposed on this optical axis, thereby condensing laser light emitted from the semiconductor laser on an optical fiber, for example, through the coupling lens and the optical isolator. In this type of conventional semiconductor laser module, however, the coupling lens is needed in addition to the optical isolator and hence the number of parts increases and the overall size also increases. In addition, since it is necessary to effect an optical positional adjustment between the coupling lens and the optical axis, the assembly operation of the semiconductor laser module is complicated and takes a great deal of time.

SUMMARY OF THE INVENTION

Accordingly, an object of the present invention to provide an element for an optical isolator which needs a relatively small number of parts and which is easy to assemble, and also provide an optical isolator and a semiconductor laser module, which employ such an optical isolator element.

It is another object of the present invention to provide an optical isolator element with a simplified structure which is designed so that, even if a laser beam is reflected from a plane of incidence or emergence of the optical isolator element, the reflected beam will not return to the semiconductor laser, and also provide an optical isolator and a semiconductor laser module, which employ such an optical isolator element.

It is still another object of the present invention to provide an optical isolator element which has a high isolation over a wide temperature range or a wide wavelength range and needs a relatively small number of parts and a relatively small number of assembling steps, and which facilitates the optical axis adjustment and displays high mass-productivity.

It is a further object of the present invention to provide an optical isolator element which is capable of satisfactorily coping with a reduction in the spacing of the laser active regions of a semiconductor laser array.

The present invention provides an element for an optical isolator which is obtained by cutting into a predetermined shape a laminate formed by alternately bonding together at least one flat plate-shaped Faraday rotator substrate and two or more flat plate-shaped polarizer substrates, the optical isolator element having an outer peripheral surface which is cut such that, when the outer peripheral surface is disposed parallel to an optical axis, incidence and emergence planes of the element are inclined at a predetermined angle with respect to a plane perpendicular to the optical axis. A lens may be bonded to or formed directly on at least one end face of the element.

According to one preferred embodiment of the present invention, there is provided an optical isolator comprises the above-describerd optical isolator element, which is accommodated and secured inside a cylindrical magnet for application of a magnetic field, the inner peripheral surface of the cylindrical magnet and the outer peripheral surface of the element being formed with substantially the same shape so that these two peripheral surfaces come in direct plane contact with each other.

According to one preferred embodiment of the present invention, there is provided a semiconductor laser module comprising a semiconductor laser accommodated in a CAN type casing and the above-described optical isolator element, which is attached in an opening provided in the casing for leading out laser light emitted from the semiconductor laser, the inner peripheral surface of the casing and the outer peripheral surface of the element being formed with substantially the same shape so that these two peripheral surfaces come in direct plane contact with each other.

Thus, when an optical isolator element with the above-described structure is placed into a magnet or a casing, since the outer peripheral surface of the optical isolator element and the inner peripheral surface of the magnet or the casing are arranged to come into direct plane contact with each other, the incidence and emergence planes of the optical isolator element are inclined at a predetermined angle with respect to a plane perpendicular to the optical axis simply by inserting the element into the magnet or the casing. Accordingly, the reflected beam from the optical isolator element itself can be prevented from returning to the light source and readily removed without the need for a special jig. In addition, there is no need for a special jig for securing the optical isolator element inside the magnet or the casing. Accordingly, the number of parts decreases, and the operation of mounting the optical isolator element in the magnet or the casing is facilitated. In addition, the effective aperture can be increased, and the overall size of the apparatus can be reduced.

In addition, the present invention provides an optical isolator comprising an optical isolator element formed by alternately bonding together at least one flat plate-shaped Faraday rotator and two or more flat plate-shaped polarizers, and a cylindrical magnet for application of a magnetic field which accommodates the optical isolator element, the magnet being provided on the inner peripheral surface thereof with an insertion portion having substantially the same shape as that of the outer peripheral surface of the element so that the outer peripheral surface of the element comes in plane contact with the insertion portion, and a step which is formed by somewhat reducing the inner diameter of the insertion portion to retain the outer peripheral edge of the element inserted into the insertion portion. With this arrangement, the optical isolator element can be readily placed in a fixed position in the magnet.

In addition, the present invention provides an element for an optical isolator obtained by cutting into a predetermined shape a laminate comprising a first flat plate-shaped polarizer substrate, a first flat plate-shaped Faraday rotator substrate, a second flat plate-shaped polarizer substrate, a second flat plate-shaped Faraday rotator substrate and a third flat plate-shaped polarizer substrate, which are successively bonded together in the mentioned order such that the directions of transmitted polarization of the first and second polarizer substrates are offset from each other by an angle determined by either adding or subtracting $\alpha°$ to or from the angle between the respective optimum set positions with respect to the first Faraday rotator substrate and the directions of transmitted polarization of the second and third polarizer substrates are offset from each other by an angle determined by subtracting or adding $\alpha°$ from or to the angle between the respective optimum set positions with respect to the second Faraday rotator substrate. The term "optimum set positions" is herein employed to mean set positions of a pair of polarizers at which the backward loss reaches a maximum when the element is arranged to function as an optical isolator. Thus, the isolation that is effected by a first optical isolator functional part comprising the first polarizer, the first Faraday rotator and the second polarizer is different in the peak position with respect to temperature or wavelength from the isolation effected by a second optical isolator functional part comprising the second polarizer, the second Faraday rotator and the third polarizer, so that the temperature or wavelength dependence of the overall isolation of the optical isolator element becomes small.

In addition, the present invention provides an optical isolator element for a laser array, comprising at least one flat plate-shaped Faraday rotator and two or more flat plate-shaped polarizers, which are alternately bonded together in the form of a laminate, which is then cut into a rectangular configuration in conformity to the arranged form of laser active regions of the laser array. This arrangement makes it possible to cope with a multiplicity of laser active regions of the laser array with a single optical isolator element.

BRIEF DESCRIPTION OF THE DRAWINGS

FIG. 8 is a side view of a semiconductor laser module formed using any one of the optical isolators shown in FIGS. 7(A), 7(B) and 7(C).

FIGS. 9(A) and 9(B) are an exploded perspective view and a perspective view, respectively, showing a CAN type semiconductor laser module formed using the optical isolator element shown in FIG. 1.

FIGS. 10(A), 10(B) and 10(C) are perspective views respectively showing CAN type semiconductor laser modules which are different in structure from the semiconductor laser module shown in FIG. 9.

FIGS. 13(A), 13(B), 13(C), 13(D), 13(E) and 13(F) show the procedure for producing the optical isolator element shown in FIG. 11.

DESCRIPTION OF THE PREFERRED EMBODIMENTS

Embodiments of the present invention will be described below in detail with reference to the accompanying drawings.

Figure 1A:
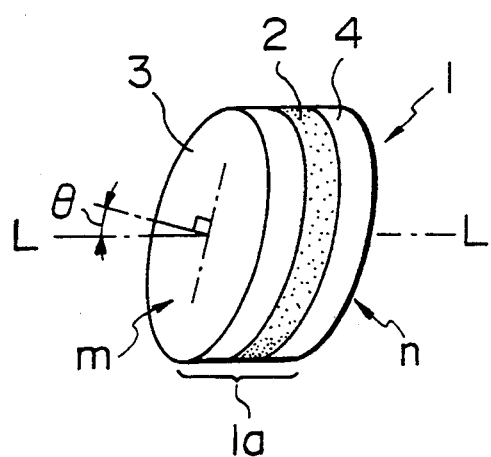
FIGS. 1(A) and 1(B) show an optical isolator element according to one embodiment of the present invention.
Figure 1B:
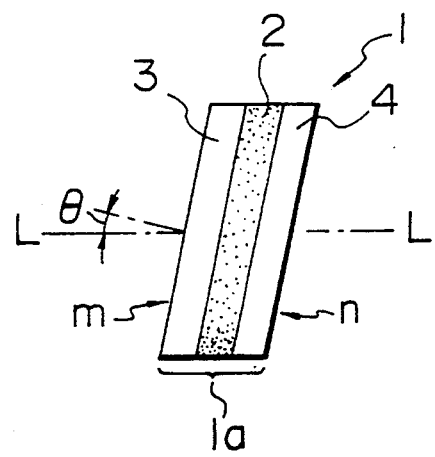

FIG. 1(A) is a perspective view of one embodiment of the optical isolator element according to the present invention, and FIG. 1(B) is a side view of the embodiment.

Referring to these figures, an element 1 for an optical isolator comprises a flat plate-shaped Faraday rotator 2 and two flat plate-shaped polarizers 3 and 4, which are bonded to both faces, respectively, of the Faraday rotator 2. The outer peripheral surface 1a of the optical isolator element 1 is defined by a circumferential plane which is a predetermined angle $\theta$ inclined with respect to a plane perpendicular to the incidence and emergence planes m and n of the element 1. In other words, the outer peripheral surface 1a of the optical isolator element 1 is defined by such a circumferential plane that when the outer peripheral surface 1a is disposed parallel to the optical axis L, the incidence and emergence planes m and n of the element 1 are a predetermined angle $\theta$ inclined with respect to a plane perpendicular to the optical axis L.

Each of the constituent parts will be explained below.

The Faraday rotator 2 is formed in an ellipsoidal shape from a Bi substituion garnet monocrystal. The Faraday rotator 2 has a thickness necessary to rotate the plane of polarization of light entering the Faraday rotator 2 from the direction of the optical axis L through a predetermined angle (45° in this embodiment) about the optical axis when a saturated magnetic field is applied to the Faraday rotator 2 in the direction of the optical axis L.

Meantime, the two polarizers 3 and 4 are also formed in an ellipsoidal shape. For example, a dichroic polarizer formed by dispersing metal molecules into a complex dielectric is employed as each of the polarizers 3 and 4. The dichroic polarizer absorbs a polarized light component in one direction of the light entering in the direction of the optical axis L.

The polarizers 3 and 4, which are bonded to both faces of the Faraday rotator 2, are disposed such that the respective directions of transmitted polarization are offset from each other about the optical axis L by a predetermined angle (i.e., the angle through which the plane of polarization of light is rotated by the Faraday rotator 2; 45° in this embodiment).

The circumferential side surface of the optical isolator element 1 is preferably coated with a metal, a resin material, etc. in order to prevent the entrance of light from the side surface and to enhance the durability. The optical isolator element 1 may also be inserted into a cylindrical metallic casing in such a manner that the side surface of the element 1 is in close contact with the casing.

If an adhesive resin material is employed to coat the circumferential side surface of the optical isolator element 1, the element 1 can be bonded directly to another member.

If the circumferential side surface of the optical isolator element 1 is coated with a metal, the element 1 can be bonded directly to another metallic member without soldering or welding.

The incidence and emergence planes m and n of the optical isolator element 1 are preferably coated with AR.

Figure 2A:
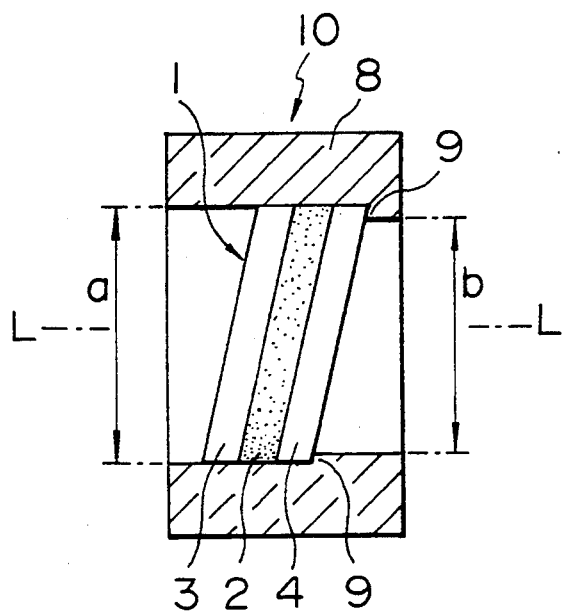
FIGS. 2(A) and 2(B) show an optical isolator formed using the optical isolator element shown in FIG. 1.
Figure 2B:
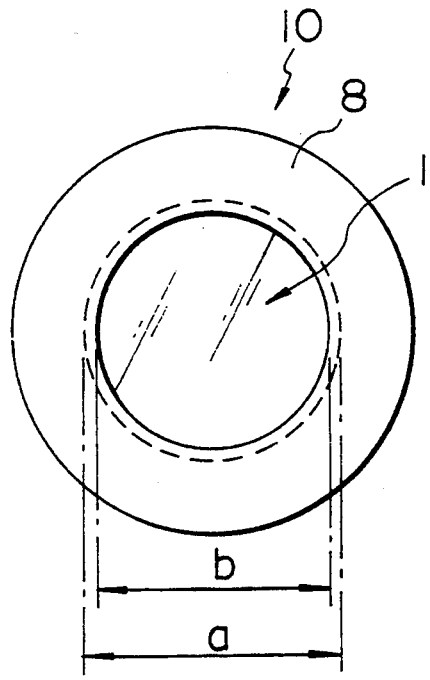

FIG. 2(A) is a sectional side view of an optical isolator 10 formed by inserting the optical isolator element 1 into a cylindrical magnet 8, and FIG. 2(B) is a front view of the optical isolator 10.

The inner peripheral surface of the magnet 8 is in the form of a circumferential plane. The left-hand portion of the inner periphery of the magnet 8 shown in FIG. 2(A) has an inner diameter a which is substantially the same as the outer diameter of the optical isolator element 1, that is, it has an inner peripheral surface in the form of a circumferential plane that is substantially similar to the outer peripheral surface of the element 1. It should be noted that the portion with the inner diameter a is defined as a portion for insertion of the optical isolator element 1. Meantime, the right-hand portion of the inner periphery of the magnet 8 shown in FIG. 2(A) has an inner diameter b which is a little smaller than the inner diameter a of the element inserting portion, thereby providing a step 9 on the inner periphery of the magnet 8. The step 9 is arranged such that, when the optical isolator element 1 is inserted into the magnet 8, the entire outer peripheral edge of the element 1 abuts against the step 9.

When the optical isolator element 1 is inserted into the insertion portion of the magnet 8, the outer peripheral surface of the element 1 is in plane contact with the inner peripheral surface of the magnet 8. Accordingly, the optical isolator 10 can be readily formed without the need for a special jig simply by bonding together the contact surfaces of the two members by use of an adhesive. At this time, the incidence and emergence planes m and n of the optical isolator element 1 are fixed with an inclination angle $\theta$ with respect to a plane perpendicular to the optical axis L.

Since in this embodiment the step 9 is provided inside the magnet 8, the outer peripheral edge of the optical isolator element 1 abuts against the step 9 when the element 1 is inserted into the magnet 8. Accordingly, the optical isolator element 1 can be reliably secured at a predetermined position in the magnet 8 without a positioning error. It should be noted that the effective aperture of the optical isolator 10 is b, as shown in FIG. 2(b). In other words, almost all of the optical isolator element 1 can be effectively used as an optical isolator.

Although the step 9 is provided in the above-described embodiment, it is not always needed. The inner diameter of the magnet 8 may be uniformly coincident with the outer diameter of the optical isolator element 1.

The operation of the optical isolator 10 will next be explained.

Referring to FIG. 2(A), when incident light (laser beam) enters the magnet 8 of the optical isolator 10 in parallel to the optical axis L from the left side as viewed in the figure, the polarizer 3 transmits only a light component of the incident light that has a predetermined plane of polarization.

The light that is transmitted by the polarizer 3 enters the polarizer 4 after the plane of polarization thereof has been rotated through 45° by the Faraday rotator 2. Since the respective directions of transmitted polarization of the polarizers 3 and 4 are 45° offset from each other, the incident light entering the polarizer 4 passes therethrough as it is.

On the other hand, when the reflected beam enters the polarizer 4, only a light component having a predetermined plane of polarization passes through the polarizer 4 to enter the Faraday rotator 2 where the plane of polarization is further rotated through 45°. Accordingly, the plane of polarization of the reflected beam entering the polarizer 3 is 90° offset from the direction of transmitted polarization of the polarizer 3. Therefore, the reflected beam cannot pass through the polarizer 3 and thus it is removed.

Although a part of the incident light that enters the optical isolator 10 from the light source side is reflected from the end faces of the polarizers 3 and 4 and the Faraday rotator 2 in the optical isolator element 1, there is no possibility of the reflected beam returning in the direction of the optical axis L because the end faces are inclined at a predetermined angle $\theta$ with respect to a plane perpendicular to the optical axis L.

FIG. 3 shows the procedure for producing the optical isolator element 1.

Figure 3A:
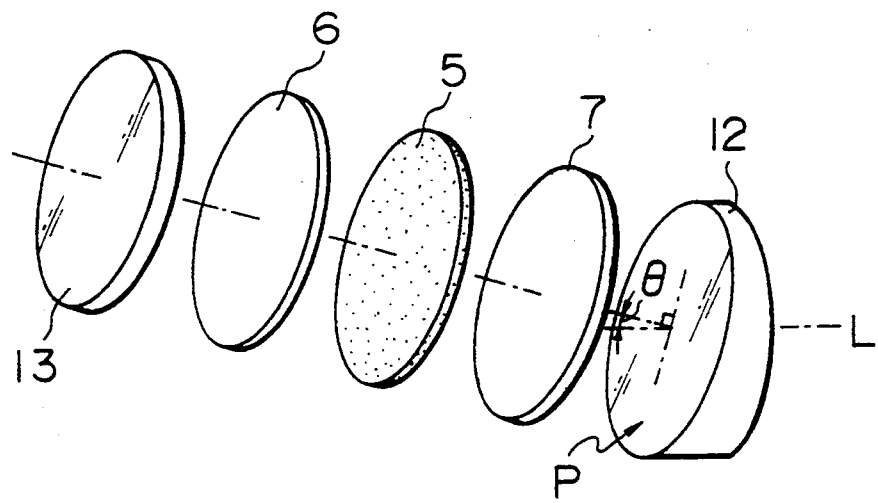
FIGS. 3(A), 3(B), 3(C), 3(D), 3(E) and 3(F) show the procedure for producing the optical isolator element shown in FIG. 1.

Referring first to FIG. 3(A), a disk-shaped, large-sized polarizer substrate 7 with a relatively large diameter is bonded to a slant surface p of a wedge-shaped cover glass 12 formed by diagonally cutting one surface of a cylindrical glass, and then a large-sized Faraday rotator substrate 5 with the same diameter as that of the polarizer substrate 7 is bonded to the polarizer substrate 7. For the bonding between the polarizer substrate 7 and the Faraday rotator substrate 5, an optical adhesive is employed, whereas, for the bonding between the wedge-shaped cover glass 12 and the polarizer substrate 7, an adhesive (e.g., a brazing material) which readily dissolves in a solvent which cannot dissolve the optical adhesive is employed. It should be noted that the inclination angle $\theta$ of the slant surface p of the wedge-shaped cover glass 12 is the same as the inclination angle $\theta$ of the optical isolator element 1 shown in FIG. 1.

Next, a polarizer substrate 6 of the same size as that of the Faraday rotator substrate 5 is bonded to the top surface of the Faraday rotator substrate 5 by use of an optical adhesive. The polarizer substrate 6 is bonded after the direction of transmitted polarization has been adjusted so as to be at a predetermined angle (45° in this embodiment) to the direction of transmitted polarization of the polarizer substrate 7 about the optical axis L.

The thickness of each of the polarizer substrates 6 and 7 is the same as that of the polarizers 3 and 4 shown in FIG. 1, and the material is also the same. In addition, the thickness of the Faraday rotator substrate 5 is the same as that of the Faraday rotator 2 shown in FIG. 1, and the material is also the same.

The surfaces of the polarizer substrate 6 and the Faraday rotator substrate 5 which are bonded together and the surfaces of the polarizer substrate 7 and the Faraday rotator substrate 5 are preferably coated with antireflection films, respectively, for preventing Fresnel reflection, which would otherwise occur due to a difference in refractive index.

Figure 3B:
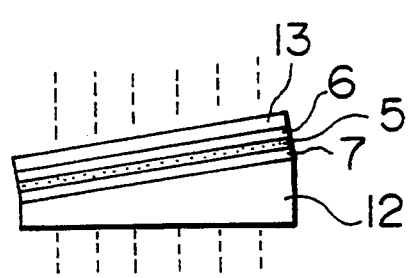

Then, a disk-shaped cover glass 13 is bonded to the surface of the polarizer substrate 6 with an adhesive (e.g., a brazing material) which readily dissolves in a solvent which cannot dissolve the optical adhesive, as shown in FIG. 3(A). FIG. 3(B) is a side view of the resulting laminate, and FIG. 3(C) is a plan view of it.

Figure 3C:
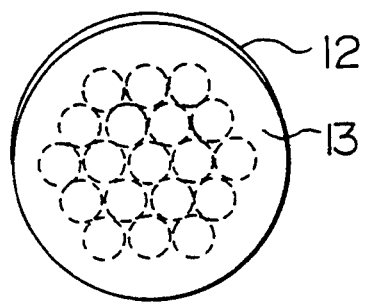
Figure 3D:
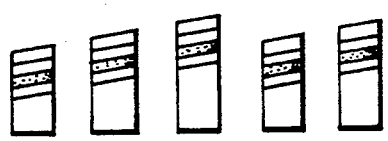
Figure 3E:
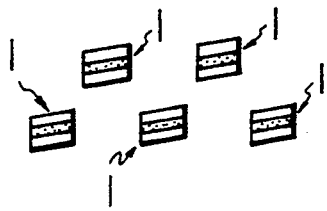

Then, the laminate comprising the substrates 5, 6 and 7 and the cover glasses 12 and 13 is cut, as shown by the chain lines in FIGS. 3(B) and 3(C), into a multiplicity of pieces with a desired shape (a cylindrical shape in this embodiment) by use of a cutting machine, thereby obtaining intermediate products as shown in FIG. 3(D).

Then, the wedge-shaped cover glass 12 and the cover glass 13 are separated by use of a solvent. Although in this embodiment the cover glasses 12 and 13 are removed, if these cover glasses 12 and 13 are bonded to the polarizer substrates 7 and 6, respectively, by use of an optical adhesive after the cover glasses 12 and 13 have been coated with necessary antireflection films, the cut piece of the laminate can be used as an optical isolator element, with the cover glasses 12 and 13 left unremoved. In such a case, the end face that is defined by the flat plate-shaped cover glass 13 is used as a plane of incidence in order to prevent the end face reflection.

Figure 3F:
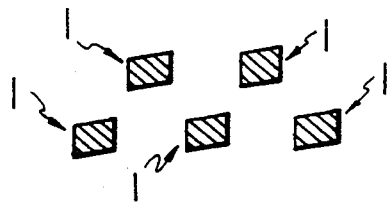

Next, the whole outer circumferential surface of the optical isolator element 1 is coated with a resin or metallic material, as shown in FIG. 3(F).

According to the above-described procedure for producing the optical isolator element 1, the adjustment of the polarizers 3 and 4 about the optical axis L needs to be effected only once at the time when the polarizer substrates 6 and 7 are bonded to the Faraday rotator substrate 5, as shown in FIG. 3(A), and it is not necessary to effect an optical adjustment for each individual optical isolator element 1. Thus, the operating efficiency is extremely high. In addition, since a multiplicity of optical isolator elements 1 are cut out from a laminate comprising the substrates 5, 6 and 7 which are laminated on the wedge-shaped cover glass 12 inclined at a predetermined angle, the inclination angle $\theta$ of the optical isolator elements 1 is the same as the inclination angle $\theta$ of the slant surface p of the wedge-shaped cover glass 12 and all the optical isolator elements 1 have the same inclination angle $\theta$, thus enabling production of a large number of optical isolator elements 1 of uniform quality.

Figure 4:
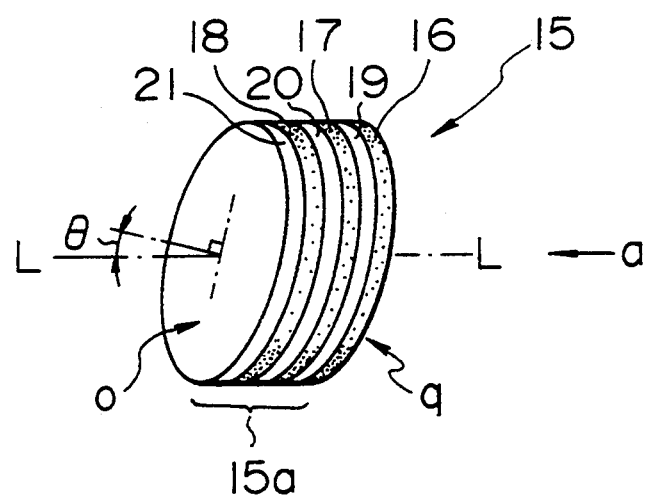
FIG. 4 is a perspective view of an optical isolator element according to another embodiment of the present invention.

FIG. 4 is a perspective view of another embodiment of the optical isolator element according to the present invention.

As shown in the figure, the optical isolator element 15 comprises three flat plate-shaped Faraday rotators 16, 17 and 18 and three flat plate-shaped polarizers 19, 20 and 21, which are alternately bonded to the Faraday rotators 16, 17 and 18, the polarizers 19, 20 and 21 being formed by dispersing metal molecules into a complex dielectric. The outer peripheral surface 15a of the optical isolator element 15 is defined by such a circumferential plane that when the outer peripheral surface 15a is disposed parallel to the optical axis L, the incidence and emergence planes o and q of the element 15 are a predetermined angle $\theta$ inclined with respect to a plane perpendicular to the optical axis L.

Each of the constituent parts will be explained below.

The Faraday rotators 16, 17 and 18 are each comprised of an ellipsoidal Bi substituion garnet monocrystal in the same way as in the case of the Faraday rotator 2 shown in FIG. 1. In addition, the Faraday rotators 16, 17 and 18 each have a thickness necessary to rotate the plane of polarization of light entering these Faraday rotators through a predetermined angle (45° in this embodiment) about the optical axis when a saturated magnetic field is applied to the Faraday rotators 16, 17 and 18 in the direction of the optical axis L.

The polarizers 19, 20 and 21 are also each formed in an ellipsoidal shape.

The respective directions of transmitted polarization of the polarizers 19, 20 and 21 are offset from each other about the optical axis L by a predetermined angle (45° in this embodiment).

Since the optical isolator element 15 comprises polarizers and Faraday rotators, which are laminated one upon another in a multi-stage structure, it is possible to form a multi-stage optical isolator and obtain a higher isolation than in the case of the optical isolator element 1 shown in FIG. 1.

Figure 5:
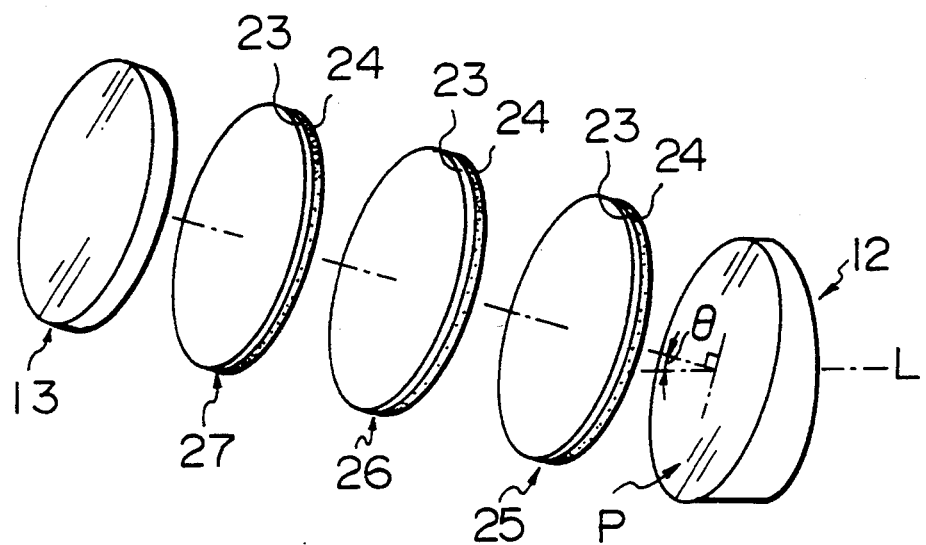
FIG. 5 shows the procedure for producing the optical isolator element shown in FIG. 4.

FIG. 5 shows the procedure for producing the optical isolator element 15.

To produce the optical isolator element 15, first, three bonded plates 25, 26 and 27 each comprising a polarizer substrate 23 and a Faraday rotator substrate 24, which are bonded together, are prepared, as shown in the figure. The bonded plates 25, 26 and 27 have the same configuration and are produced, for example, by cutting a larger bonded plate comprising a larger polarizer substrate and a larger Faraday rotator substrate, which are bonded together.

These bonded plates 25, 26 and 27 are successively bonded to the slant surface p of the wedge-shaped cover glass 12, and the cover glass 13 is then bonded thereto to obtain a laminated plate. At this time, the bonded plates 25, 26 and 27 are bonded after the directions of transmitted polarization of the respective polarizer substrates 23 have been rotated relative to each other through a predetermined angle (45° in this embodiment) about the optical axis L. Since the method of cutting out the optical isolator element 15 from the laminated plate is similar to the method shown in FIGS. 3(B) to 3(F), description thereof is omitted.

Although the multi-stage optical isolator element 15 according to this embodiment comprises three polarizers and three Faraday rotators, which are alternately stacked up, it should be noted that the present invention is not necessarily limitative thereto and that the respective numbers of polarizers and Faraday rotators may be two or more than three each (the respective numbers of polarizers and Faraday rotators may be different from each other).

Although in the embodiments shown in FIGS. 1 to 4 the outer peripheral surface of the optical isolator element is formed in a circumferential shape so that it will come into close contact with the inner peripheral surface of the cylindrical magnet, the shape of the outer peripheral surface may be changed variously. In short, any combination of shapes may be employed as long as the outer peripheral surface of the optical isolator element and the inner peripheral surface of the magnet are substantially similar so as to come into plane contact with each other.

FIG. 6 is a perspective view of optical isolator elements 30, 32, 34 and 36 according to another embodiment in which a lens is bonded directly to the optical isolator element 1 shown in FIG. 1.

Figure 6A:
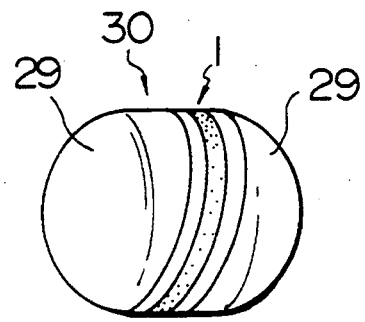
FIGS. 6(A), 6(B), 6(C) and 6(D) are perspective views respectively showing optical isolator elements according to another embodiment in which a lens is bonded directly to each end face of the optical isolator element shown in FIG. 1.
Figure 6B:
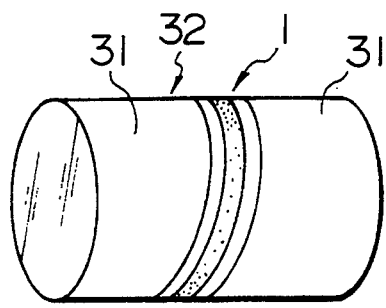
Figure 6C:
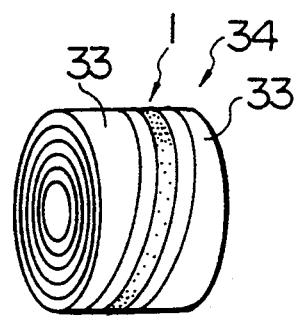
Figure 6D:
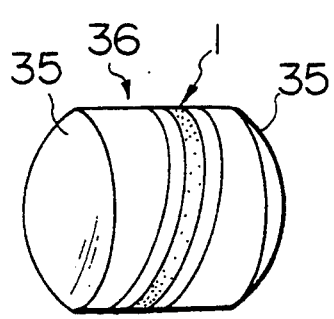

More specifically, approximately hemispherical lenses 29 such as those shown in FIG. 6(A) may be bonded to both faces, respectively, of the optical isolator element 1 (or the optical isolator element 15 shown in FIG. 4) to form an optical isolator element 30; rod lenses 31 such as those shown in FIG. 6(B) may be bonded to the optical isolator element 1 to form an optical isolator element 32; Fresnel lenses 33 such as those shown in FIG. 6(C) may be bonded to the optical isolator element 1 to form an optical isolator element 34 (the Fresnel lenses may be formed directly on the respective polarizers); or semiconvex lenses such as those shown in FIG. 6(D) may be bonded to the optical isolator element 1 to form an optical isolator element 36. In any case, since the outer pripheral surfaces of lenses have the same circumferential shape as that of the outer peripheral surface of the optical isolator element 1, when an optical isolator element with these lenses attached thereto is inserted into a cylindrical magnet, the outer peripheral surface of the optical isolator element 1 can be brought into direct plane contact with the inner peripheral surface of the magnet. This arrangement effectively enables the optical isolator element itself to have a lens function. It should be noted that lenses with other structures may be employed as those which are bonded to both end faces of the optical isolator element 1 and that the arrangement may also be such that a lens is bonded to only either one of the end faces of the optical isolator element 1.

Thus, if a lens is bonded or formed directly on at least one end face of an optical isolator element, this element can be incorporated in a magnet without the need to effect an optical positional adjustment of the lens system again, and it is therefore possible to facilitate the assembly and achieve a reduction in the overall size of the resulting apparatus.

FIG. 7 is a sectional side view showing lensed optical isolators 38, 42 and 45 formed by use of the optical isolator element 1 shown in FIG. 1.

Figure 7A:
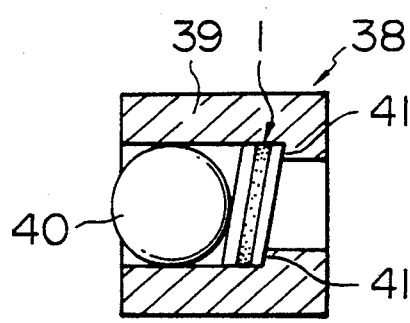
FIGS. 7(A), 7(B) and 7(C) are sectional side views respectively showing lensed optical isolators each formed using the optical isolator element shown in FIG. 1.

The optical isolator 38 shown in FIG. 7(A) comprises a cylindrical magnet 39, the optical isolator element 1 shown in FIG. 1, and a coupling lens 40 comprising a spherical lens (a lens with a different structure may also be employed), the element 1 and the lens 40 being inserted together in the magnet 39. The inner peripheral surface of the magnet 39 is provided with a portion for insertion of the optical isolator element 1, which has an inner diameter substantially equal to the outer diameter of the element 1, and a step 41 against which the optical isolator element 1 abuts.

Figure 7B:
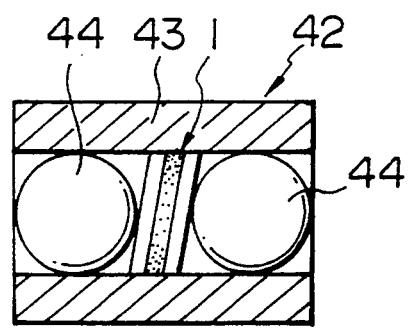

The optical isolator 42 shown in FIG. 7(B) comprises a cylindrical magnet 43 (the shape of the inner peripheral surface of which is the same as the shape of the outer peripheral surface of the optical isolator element 1), the optical isolator element 1 inserted in the magnet 43, and coupling lenses 44 inserted in the magnet at both sides, respectively, of the element 1.

Figure 7C:
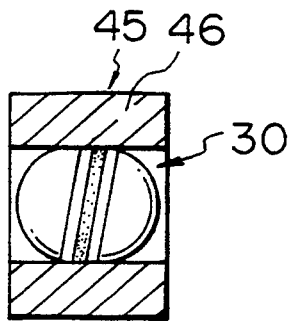

The optical isolator 45 shown in FIG. 7(C) comprises a cylindrical magnet 46 and the optical isolator element 30 shown in FIG. 6(A) which is inserted in the magnet 46. This arrangement enables a further reduction in the overall size of the optical isolator.

In any of the optical isolators 38, 42 and 45, the outer peripheral surface of the optical isolator element 1 is in direct plane contact with the inner peripheral surface of the magnet 39, 43 or 46 and hence the incidence and emergence planes of the optical isolator element 1 are fixed with a predetermined angle $\theta$ of inclination with respect to a plane perpendicular to the optical axis.

FIG. 8 shows a semiconductor laser module 50 which is formed by use of the above-described optical isolator 38, 42 or 45. The semiconductor laser module 50 can be formed simply by disposing a semiconductor laser 51 and an optical fiber 52 at both sides, respectively, of the optical isolator 38, 42 or 45, as illustrated.

FIG. 9(A) is an exploded perspective view of a CAN type semiconductor laser module 55 that employs the optical isolator element 1 shown in FIG. 1, and FIG. 9(B) is a perspective view of the semiconductor laser module 55.

As illustrated in these figures, the semiconductor laser module 55 comprises a CAN type casing 56, a semiconductor laser chip 57 that is accommodated inside the casing 56 and secured to the bottom thereof, and an optical isolator element 1 with the structure shown in FIG. 1, which is inserted into an upper diagonally cut opening 58 of the casing 56, with the outer peripheral surface of the element 1 being in direct plane contact with the inner peripheral surface of the casing 56. Since the inner peripheral surface of the casing 56 and the outer peripheral surface of the optical isolator element 1 have approximately the same shape, the optical isolator element 1 can be set with a predetermined inclination angle simply by bringing the inner and outer peripheral surfaces into close contact with each other.

If a necessary magnetic field is externally applied to the optical isolator element 1, the element 1 functions as an optical isolator. Thus, the reflected beam toward the semiconductor laser chip 57 is cut off, and the light that is reflected by the optical isolator element 1 itself will not return to the semiconductor laser chip 57 either.

FIG. 10 is a perspective view showing CAN type semiconductor laser modules 61, 63 and 65 with other structures.

The semiconductor laser module 61 shown in FIG. 10(A) differs from the semiconductor laser module 55 shown in FIG. 9 in that the casing 56' itself is formed from a magnet. This arrangement eliminates the need for attaching a magnet separately. The casing 56' may be formed from an electromagnet.

The semiconductor laser modules 63 and 65 shown in FIGS. 10(B) and 10(C) are formed by use of an optical isolator with a lens bonded thereto, as shown in FIG. 6, in place of the optical isolator element 1 shown in FIG. 9.

More specifically, the semiconductor laser module 63 shown in FIG. 10(B) employs an optical isolator element 64 comprising the optical isolator element 1 shown in FIG. 1 and a hemispherical lens 29 such as that shown in FIG. 6(A), which is bonded to the upper end face (or each end face) of the element 1. The semiconductor laser module 65 shown in FIG. 10(C) employs an optical isolator element 66 comprising the optical isolator element 1 shown in FIG. 1 and a Fresnel lens 33 such as that shown in FIG. 6(C), which is bonded to the upper end face (or each end face) of the element 1 (it is also possible to form a Fresnel lens directly on the face of a polarizer of the optical isolator element 1). In the semiconductor laser module 65 shown in FIG. 10(C), the opening at the upper end of the casing 56" for insertion of the optical isolator element 66 is not diagonally cut; however, this arrangement is also effective.

The arrangements shown in FIGS. 10(B) and 10(C) eliminate the need for attaching a coupling lens separately, so that the overall size and weight of the apparatus can be reduced and the alignment between optical parts is facilitated.

Figure 11A:
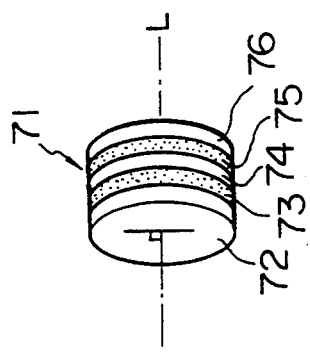
FIG. 11(A) is a perspective view of an optical isolator element according to another embodiment of the present invention, which is only slightly dependent on temperature.
Figure 11B:
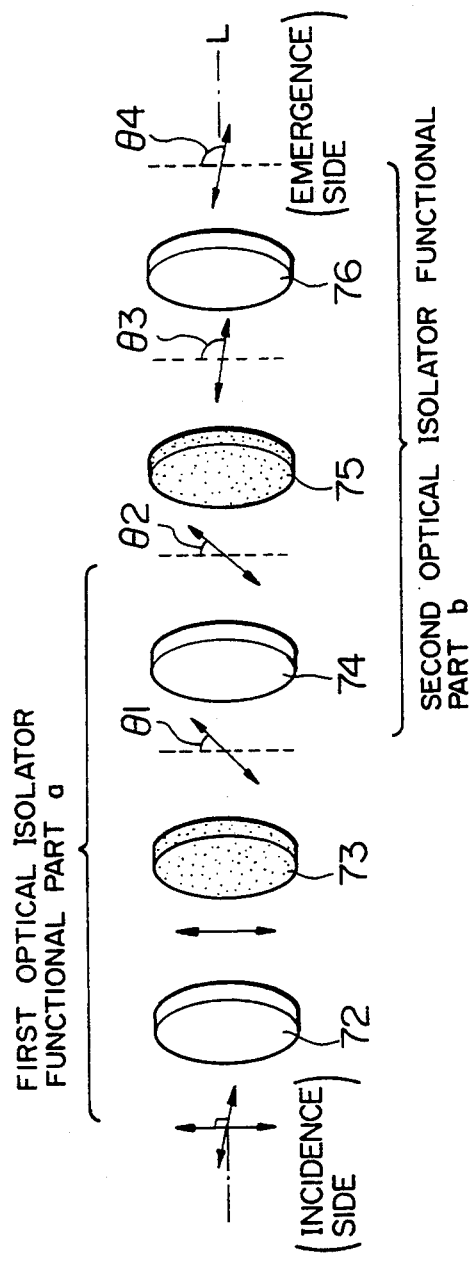
FIG. 11(B) illustrates the functions of the optical isolator element shown in FIG. 11(A).

FIG. 11(A) is a perspective view of an optical isolator element 71 according to another embodiment of the present invention, which is only slightly dependent on temperature. FIG. 11(B) shows the functions of the optical isolator element 71.

Referring to FIG. 11(A), the optical isolator element 71 comprises a first disk-shaped polarizer 72, a first disk-shaped Faraday rotator 73, a second disk-shaped polarizer 74, a second disk-shaped Faraday rotator 75, and a third disk-shaped polarizer 76, which are successively bonded together in the mentioned order.

The first and second Faraday rotators 73 and 75 are formed with the same shape and the same thickness from Bi substitution garnet monocrystal. Each Faraday rotator has a thickness necessary to rotate the plane of polarization of light entering thereto from the direction of the optical axis L (i.e., the direction perpendicular to the plane of incidence) through a predetermined angle when the temperature T=25°.

Meantime, the three polarizers 72, 74 and 76 comprise plate-shaped dichroic polarizers or flat plate-shaped polarizers formed by dispersing metal molecules into a complex dielectric, the three polarizers having the same shape and the same thickness.

In the present invention, the first and second polarizers 72 and 74 are disposed such that the respective directions of transmitted polarization are $(45-\alpha)°$ offset from each other with respect to the optical axis L. The second and third polarizers 74 and 76 are disposed such that the respective directions of transmitted polarization are $(45+\alpha)°$ offset from each other with respect to the optical axis L.

It should be noted that the circumferential surface of the optical isolator element 71 is coated with a metal, a resin or other material, although not shown.

Figure 12A:
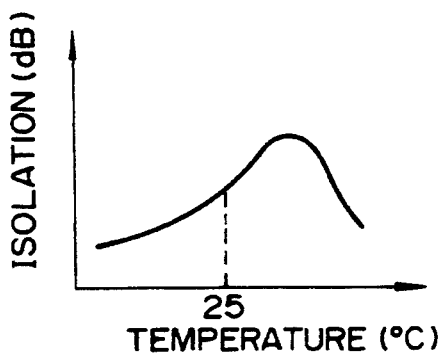
FIGS. 12(A), 12(B), 12(C) and 12(D) exemplarily show temperature characteristics of the isolation effected by the optical isolator element shown in FIG. 11 and Faraday rotation angle-to-temperature characteristics of Faraday rotators employed in the optical isolator element shown in FIG. 11.
Figure 12B:
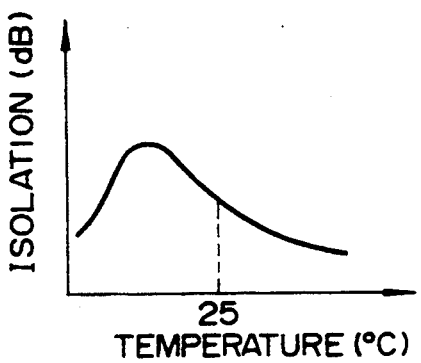

The operation of the optical isolator element 71 will next be explained with reference to FIG. 11(B). In this optical isolator element 71, the first polarizer 72, the first Faraday rotator 73 and the second polarizer 74 constitute in combination a first optical isolator functional part a, while the second polarizer 74, the second Faraday rotator 75 and the third polarizer 76 constitute in combination a second optical isolator functional part b, as illustrated in the figure. Although not shown, a magnetic field is externally applied to the optical isolator element 71 in the direction of the optixal axis L. FIG. 12(D) shows Faraday rotation angle-to-temperature characteristics of the first and second Faraday rotators 73 and 75 in the optical isolator element 71 according to this embodiment.

When light enters the first polarizer 72 in parallel to the optical axis L, only a light component of the incident light that has a predetermined plane of polarization passes through the first polarizer 72 and enters the second polarizer 74 after the plane of polarization has been rotated through a predetermined angle ($\theta 1 = 45°$ when the temperature T=25°) by the first Faraday rotator 73. Since the direction $\theta$ of transmitted polarization of the second polarizer 74 is offset from that of the first polarizer 72 not by 45° but by $\theta 2 = (45-\alpha)°$, the isolation of the first optical isolator functional part a has a peak at a higher temperature than the temperature T=25°, as shown in FIG. 12(A).

The light transmitted through the second polarizer 74 enters the third polarizer 76 after the plane of polarization has been rotated through a predetermined angle [45° when the temperature T=25°, i.e., $\theta = (90-\alpha)°$ in total] by the second Faraday rotator 75. Since the direction of transmitted polarization of the third polarizer 76 is offset from that of the second polarizer 74 not by 45° but by $\theta = (45+\alpha)°$ ($\theta 4 = 90°$ in total), the isolation of the second optical isolator functional part b has a peak at a lower temperature than the temperature T=25°, as shown in FIG. 12 (B).

Figure 12C:
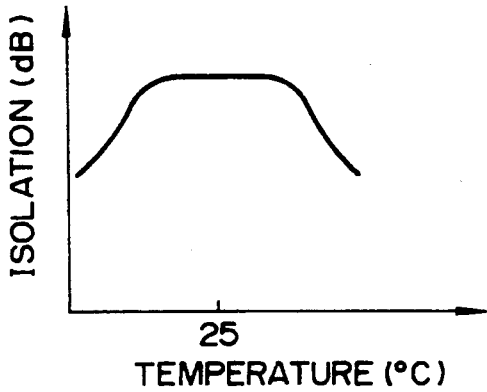
Figure 12D:
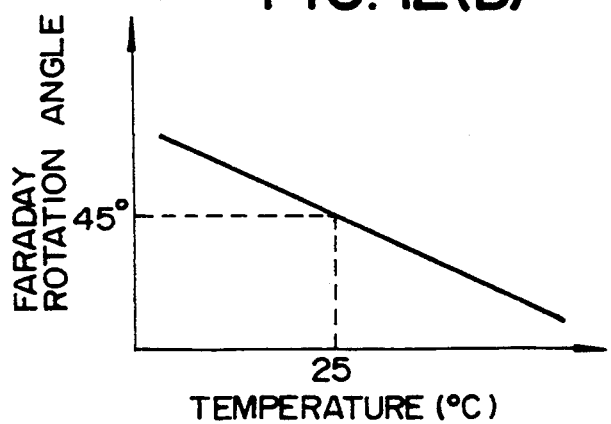

Accordingly, the overall isolation of the first and second optical isolator functional parts a and b is high over a wide temperature range, as shown in FIG. 12(C).

To produce the optical isolator element 71, first, a first disk-shaped Faraday rotator substrate 79 with a relatively large diameter and a second disk-shaped polarizer substrate 80 with the same diameter as that of the first Faraday rotator substrate 79 are bonded together to form a laminate, and a second disk-shaped Faraday rotator substrate 81 and a third disk-shaped polarizer substrate 82, which have the same diameter, are bonded together to form another laminte, as shown in FIG. 13(A). Then, these two laminates are bonded together after the respective directions of transmitted polarization of the second and third polarizer substrates 80 and 82 have been adjusted to be offset from each other by $(45+\alpha)°$ about the optical axis L. Next, as shown in FIG. 13(B), a first polarizer substrate 78 with the same diameter as that of each of the above-described substrates is bonded to the surface of the first Faraday rotator substrate 79 after the direction of transmitted polarization of the first polarizer substrate 78 has been adjusted so as to be $(45-\alpha)°$ offset from that of the second polarizer substrate 80 and, at the same time, 90° offset from the direction of transmitted polarization of the third polarizer substrate 82, thereby obtaining a laminate structure shown in FIG. 13(C). It should be noted that these optical adjustments are carried out at or near a room temperature of 25° C.

Next, the laminate structure comprising the substrates bonded together is cut to produce a multiplicity of optical isolator elements 71, as shown in FIG. 13(D). Next, the whole outer peripheral surface of each optical isolator element 71 is coated with a resin or metallic material, as shown in FIG. 13(E). Then, the optical isolator element 71 is inserted into a cylindrical magnet 83 and secured therein to complete an optical isolator 84, as shown in FIG. 13(F).

It should be noted that the present invention may be employed to level out not only the temperature characteristics but also the wavelength dependence. To level out the wavelength dependence, the respective directions of transmitted polarization of the first, second and third polarizers 78, 80 and 82 should be adjusted, for example, such that the isolation of the first optical isolator functional part a has a peak at a lower wavelength than a predetermined one and, at the same time, the isolation of the second optical isolator functional part b has a peak at a higher wavelength than a predetermined one.

The outer peripheral surface of the optical isolator element 71 may also be cut so that, when the outer peripheral surface is disposed parallel to the optical axis, the incidence and emergence planes of the optical isolator element 71 are inclined at a predetermined angle with respect to a plane perpendicular to the optical axis, as shown in FIGS. 1 and 4.

It is also possible to bond or form a lens directly on at least one end face of the optical isolator element 71 (including the arrangement that the outer peripheral surface of the element 71 is cut so that the incidence and emergence planes are inclined at a predetermined angle with respect to a plane perpendicular to the optical axis), as has been described in connection with FIG. 6.

Figure 14A:
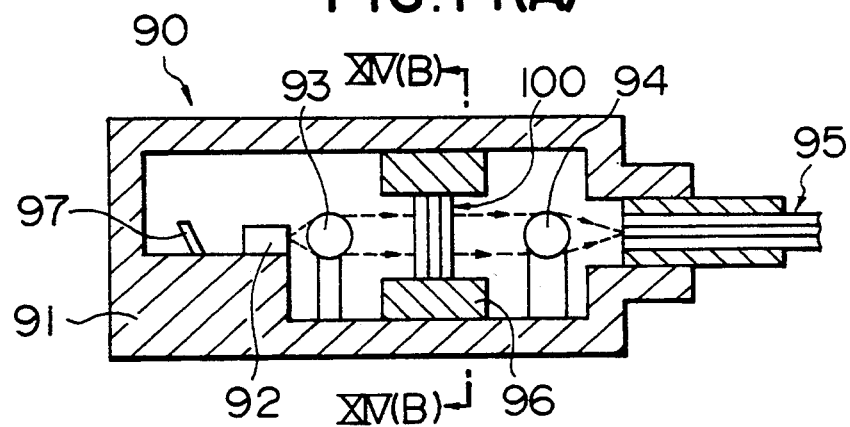
FIGS. 14(A), 14(B) and 14(C) show a semiconductor laser array module employing an optical isolator element according to the present invention.
Figure 14B:
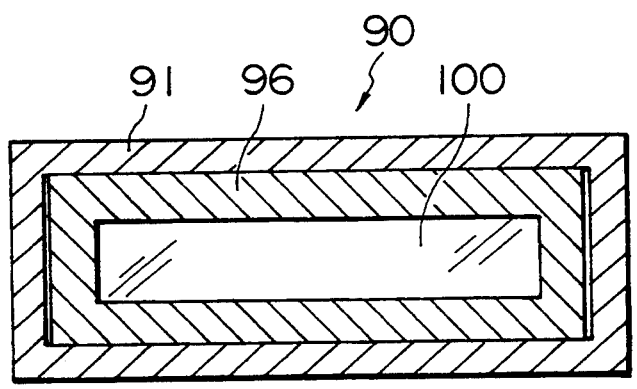
Figure 14C:
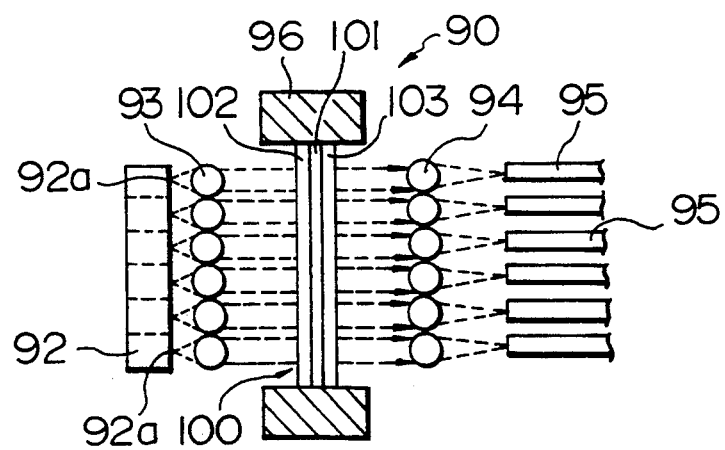

FIG. 14(A) is a sectional side view of a semiconductor laser array module 90 employing an optical isolator element according to the present invention; FIG. 14(B) is a sectional view taken along the line XIV(B)—XIV(B) of FIG. 14(A); and FIG. 14(C) is a plan view of an essential part of the semiconductor laser array module 90.

As shown in these figures, the semiconductor laser array module 90 comprises a semiconductor laser array 92, a group of spherical lenses 93, an optical isolator element 100, a group of spherical lenses 94 and a group of optical fibers 95, which are disposed in a straight line inside a casing 91, and a magnet 96 which is disposed around the optical isolator element 100. Each of the constituent parts will be explained below.

Figure 15:
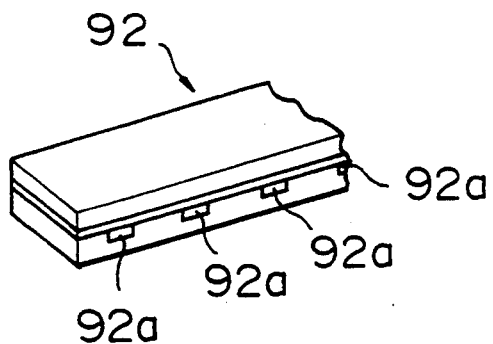
FIG. 15 is a perspective view of a part of a semiconductor laser array in the semiconductor laser array module shown in FIG. 14.

Referring to FIG. 14 and FIG. 15, which is a perspective view of a part of the semiconductor laser array 92, the array 92 comprises six laser active regions 92a which are arrayed in a line in close proximity to each other.

Each of the groups of spherical lenses 93 and 94 comprises six spherical lenses which are disposed parallel to each other to correspond to the six laser active regions 92a, respectively, of the semiconductor laser array 92, as shown in FIG. 14.

Figure 16:
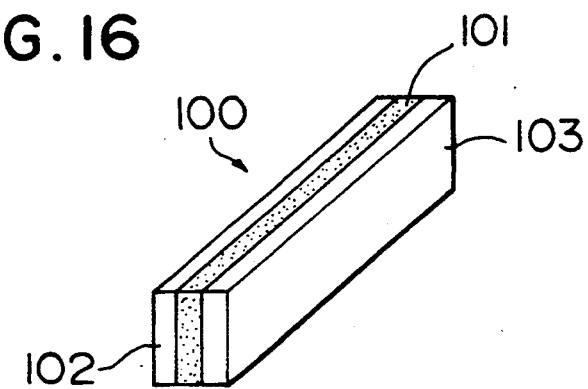
FIG. 16 is a perspective view of the optical isolator element employed in the semiconductor laser array module shown in FIG. 14.

Referring to FIG. 16, which is a perspective view of the optical isolator element 100, the element 100 comprises a rectangular, flat plate-shaped Faraday rotator 101 and two rectangular, flat plate-shaped polarizers 102 and 103, which are similar in shape to the Faraday rotator 101 and bonded respectively to both end faces of it.

Since the material and thickness of the Faraday rotator 101 are similar to those of the Faraday rotator 2 shown in FIG. 1 and the material of the two polarizers 102 and 103 is similar to that of the two polarizers 3 and 4 shown in FIG. 1, detailed description thereof is omitted. In addition, the two polarizers 102 and 103 are bonded to the Faraday rotator 101 in respective positions where the respective directions of transmitted polarization are offset from each other by a predetermined angle (45° in this embodiment) about the optical axis.

It should be noted that the outer peripheral surface of the optical isolator element 100 has a shape with which it can come in close contact with the inner peripheral surface of the magnet 96.

FIG. 17 shows the procedure for producing the optical isolator element 100.

Figure 17A:
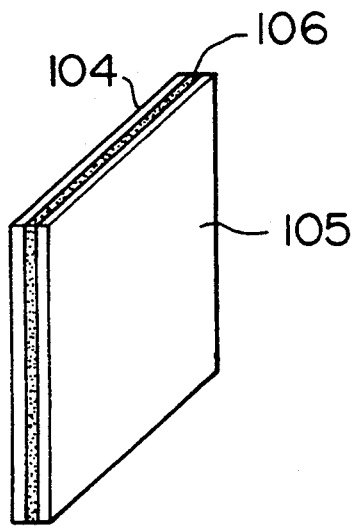
FIGS. 17(A) and 17(B) show the procedure for producing the optical isolator element shown in FIG. 16.
Figure 17B:
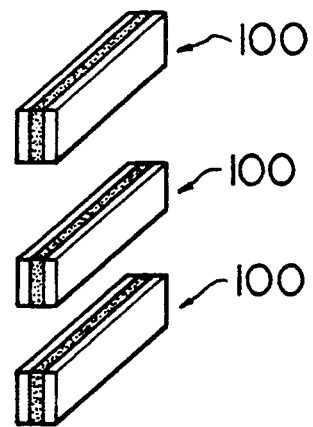

First, two flat plate-shaped polarizer substrates 104 and 105, which have the same area, are bonded to both sides, respectively, of a Faraday rotator substrate 106, as shown in FIG. 17(A). At this time, the two polarizer substrates 104 and 105 are bonded in respective positions where the respective directions of transmitted polarization are offset from each other by a predetermined angle (45° in this embodiment). Then, as shown in FIG. 17(B), the laminate comprising the three substrates bonded together is cut into a multiplicity of optical isolator elements 100 with a shape such as that shown in FIG. 16.

The magnet 96 is disposed to surround the optical isolator element 100, as shown in FIG. 14, to apply a magnetic field to the Faraday rotator 101.

The respective end portions of the six optical fibers 9 are attached to the casing 91 in parallel to each other, as shown in FIG. 14. Reference numeral 97 in FIG. 14 denotes a monitoring PD.

The operation of the semiconductor laser array module 90 will next be explained.

Laser light emitted from each laser active region 92a in the semiconductor laser array 92 is formed into parallel rays through the corresponding spherical lens 93 before entering the optical isolator element 100, which transmits only predetermined linearly polarized light. The transmitted light is condensed again through the corresponding spherical lens 94 so as to be introduced into the core of the corresponding optical fiber 95.

Meantime, part of the light that is reflected from the end faces of the optical fibers 95, the end faces of optical elements in the transmission path, connectors, etc. return to the optical isolator element 100. However, the reflected beam cannot pass through the optical isolator element 100 and it is removed. Therefore, no reflected beam returns to the laser active regions 92a.

The above-described arrangement makes it possible to cope with a multiplicity of laser active regions 92a using only a single optical isolator element 100 and hence enables a reduction in the overall size of the semiconductor laser array module 90.

Figure 18A:
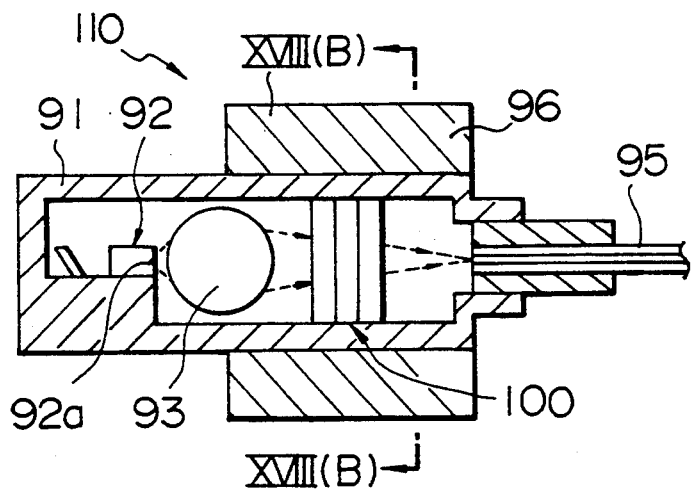
FIGS. 18(A) and 18(B) show another semiconductor laser array module employing the optical isolator element shown in FIG. 16.
Figure 18B:
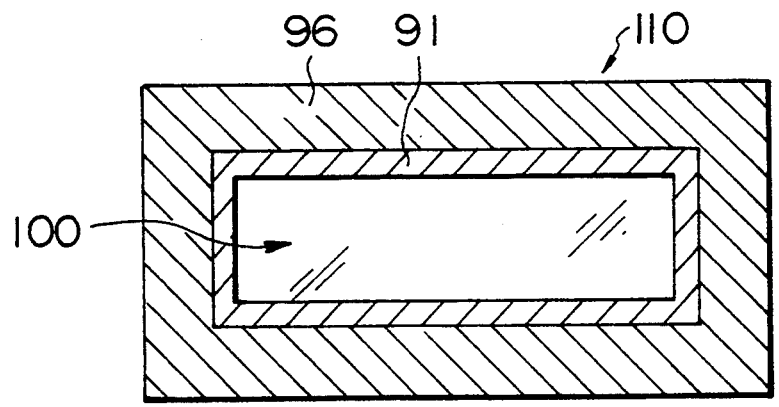

FIG. 18(A) is a sectional side view of a semiconductor laser array module 110 employing the optical isolator element 100, which is different in structure from the semiconductor laser array module 90. FIG. 18(B) is a sectional view taken along the line XVIII(B)—XVIII(B) of FIG. 18(A).

The embodiment illustrated in these figures differs from the semiconductor laser array module 90 in that a magnet 96 is disposed outside a casing 92 and that laser light emitted from a laser active region 92a is condensed directly to the core of an optical fiber 95 through a spherical lens 93 without employing a spherical lens 94.

It should be noted that the outer peripheral surface of the optical isolator element 100 has a shape with which it can come in close contact with the inner peripheral surface of the casing 91.

Since the outer peripheral surface of the optical isolator element 100 is arranged to come in direct plane contact with the inner peripheral surface of the magnet 96 or the casing 91, the two members can be readily secured to each other simply by bonding the contact surfaces of these two members by means of an adhesive or the like, without employing a special jig.

Figure 19:
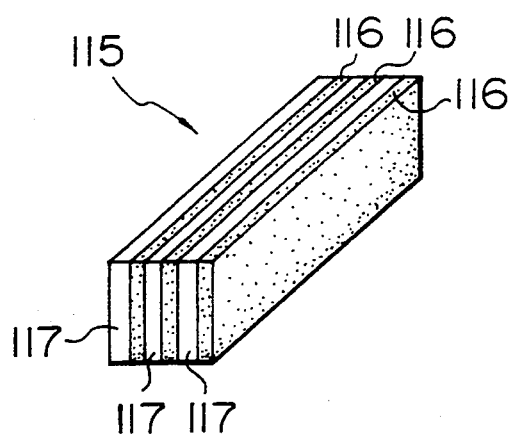
FIG. 19 is a perspective view of an optical isolator element according to another embodiment of the present invention.

FIG. 19 is a perspective view of another embodiment of the optical isolator element according to the present invention.

Referring to the figure, an optical isolator element 115 is formed by alternately bonding together three rectangular flat plate-shaped Faraday rotators 116 and three rectangular flat plate-shaped polarizers 117, which are similar in shape to the Faraday rotators 116.

Each of the three Faraday rotators 116 has a thickness necessary for the plane of polarization of light entering the Faraday rotator 116 to rotate about the optical axis through 45° when a predetermined magnetic field is applied thereto. The three polarizers 117 are bonded in such a manner that the respective directions of transmitted polarization are 45° offset from each other about the optical axis.

By alternately laminating polarizers and Faraday rotators in a multi-stage structure as described above, it is possible to obtain a higher isolation than in the case of the optical isolator element 100 shown in FIG. 16.

FIG. 20 shows the procudure for producing the optical isolator element 115.

Figure 20A:
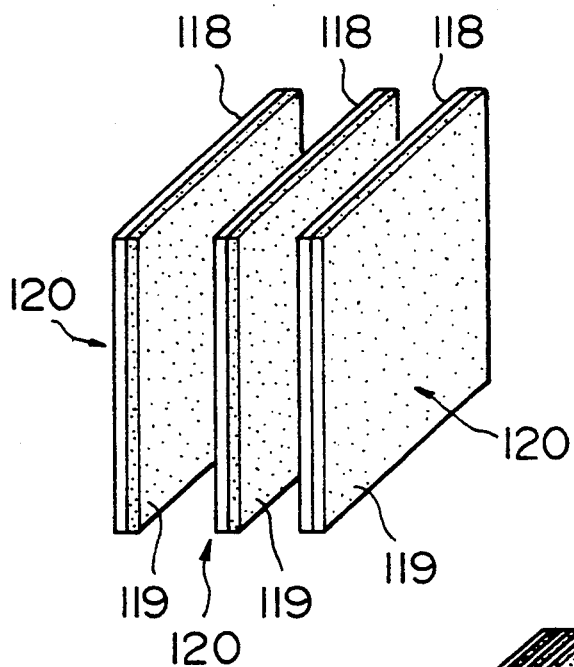
FIGS. 20(A), 20(B) and 20(C) show the procedure for producing the optical isolator element shown in FIG. 19.
Figure 20B:
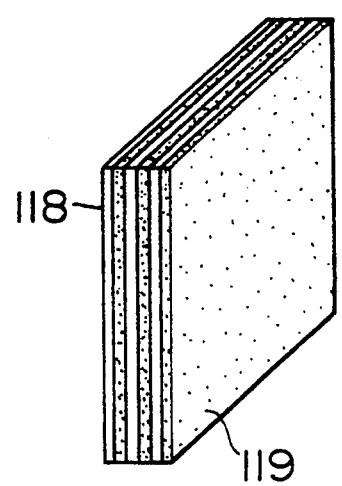

First, three bonded plates each comprising a pair of relatively large flat plate-shaped polarizer substrate 118 and Faraday rotator substrate 119, which are bonded together as shown in FIG. 20(A), are bonded together to form a laminated plate, as shown in FIG. 20(B).

At this time, the bonded plates 120 are bonded such that the respective planes of polarization of the polarizer substrates 118 are 45° offset from each other.

Figure 20C:
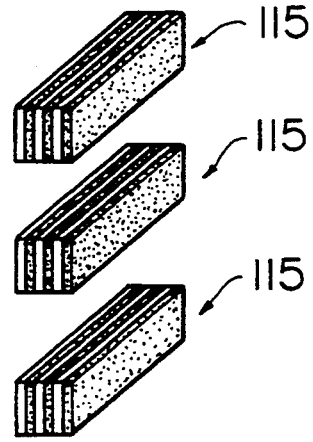

Then, the laminated plate is cut into a multiplicity of pieces, as shown in FIG. 20(C), thereby obtaining optical isolator elements 115 as shown in FIG. 19.

It should be noted that the respective numbers of Faraday rotators and polarizers are not limited to those mentioned above, as a matter of course.

Figure 21A:
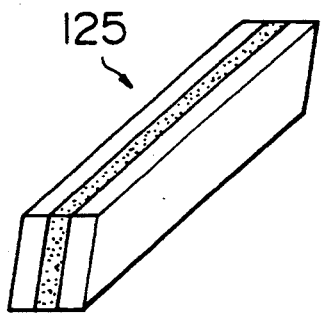
FIGS. 21(A) and 21(B) show an optical isolator element according to another embodiment of the present invention.
Figure 21B:
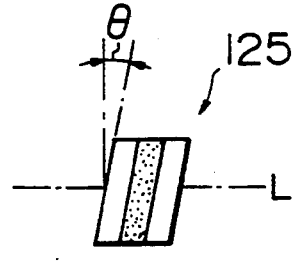

FIG. 21(A) is a perspective view of another embodiment of the optical isolator element according to the present invention, and FIG. 21(B) is a side view of the embodiment. The optical isolator element 125 shown in these figures differs from the optical isolator element 100 shown in FIG. 16 in that the incidence and emergence planes of the optical isolator element 125 are cut with a predetermined angle θ of inclination with respect to a plane perpendicular to the optical axis L so that the element 125 has a parallelogrammatic cross-section. In other words, the incidence and emergence planes of the optical isolator element 125 are cut so that, when the outer peripheral surface of the element 125 is disposed parallel to the optical axis L, the incidence and emergence planes are a predetermined angle θ inclined with respect to a plane perpendicular to the optical axis L.

The optical isolator element 125 thus cut is inserted into the magnet 96 shown in FIG. 14 or the casing 91 shown in FIG. 18 such that the outer peripheral surface thereof is in close contact with the inner peripheral surface of the magnet 96 or the casing 91. In consequence, the incidence and emergence planes of the optical isolator element 125 are not perpendicular to the optical axis. Accordingly, light that is reflected by the optical isolator element 125 will not return to the laser active regions 92a. This advantageous effect is the same as that in the case of the embodiments shown in FIGS. 1 and 4.

Figure 22A:
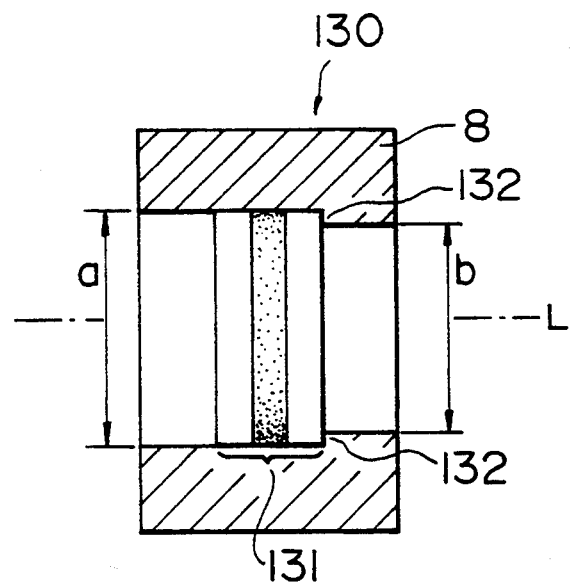
FIGS. 22(A) and 22(B) are sectional side views of an optical isolator according to another embodiment of the present invention.
Figure 22B:
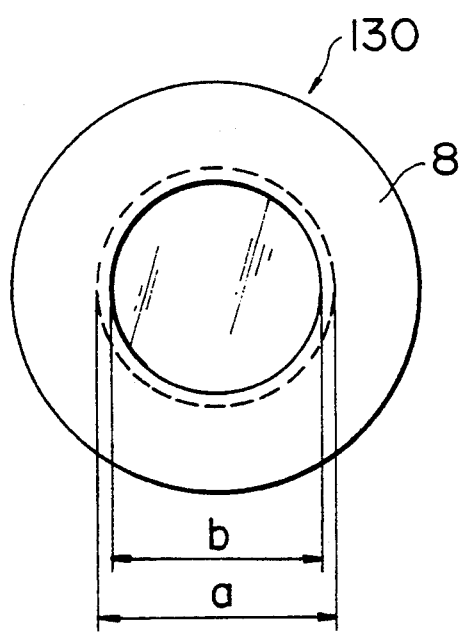

FIG. 22 is a sectional side view of an optical isolator according to a still further embodiment of the present invention. In this figure, the same portions or elements as those of the optical isolator 10 shown in FIG. 2 are denoted by the same reference numerals, and description thereof is omitted. The optical isolator 130 shown in FIG. 22 differs from the optical isolator 10 shown in FIG. 2 in that the optical isolator element 131 has a cylindrical configuration and the configuration of the step 132 is correspondingly different from that of the step 9 shown in FIG. 2. In a case where the reflected beam from the optical isolator element 131 itself is not a problem, the incidence and emergence planes of the optical isolator element 131 may be perpendicular to the optical axis L.

The present invention may be carried out in various other formes without departing from the spirit and principal features thereof. Accordingly, the foregoing embodiments are merely illustrative in all respects and should not be construed exclusively. The scope of the present invention is limited solely by the appended claims, and it is not bound by the statement in this specification. In addition, changes and modifications which belong to the range of equivalence of the appended claims all come within the scope of the present invention.

What we claim is:

1. An optical isolator element which is disposed in front of a laser array comprised of a plurality of laser active regions arranged in parallel, comprising
at least one flat plate-shaped Faraday rotator and
two or more flat plate-shaped polarizers which are alternately bonded together in a rectangular configuration in conformity to the arranged form of said laser active regions of said laser array, the at least one flat plate-shaped Faraday rotator and the two or more flat plate-shaped polarizers forming a laminate, wherein the outer peripheral surface of said element is cut such that, said outer peripheral surface is disposed parallel to an optical axis, incidence and emergence planes of said element are inclined at a predetermined angle with respect to a plane perpendicular to the Optical axis.

* * * * *